United States Patent
Ma et al.

(10) Patent No.: US 6,472,721 B2
(45) Date of Patent: Oct. 29, 2002

(54) DUAL DAMASCENE INTERCONNECT STRUCTURES THAT INCLUDE RADIO FREQUENCY CAPACITORS AND INDUCTORS

(75) Inventors: Ssu-Pin Ma, Taipei (TW); Chun-Hon Chen, Hsin-Chu (TW); Ta-Hsun Yeh, Hsin-chu (TW); Kuo-Reay Peng, Tansung (TW); Heng-Ming Hsu, Hsin chu (TW); Kong-Beng Thei, Hsin-chu (TW); Chi-Wu Chou, Hsin-chu (TW); Yen-Shih Ho, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/963,749

(22) Filed: Sep. 27, 2001

(65) Prior Publication Data

US 2002/0019123 A1 Feb. 14, 2002

Related U.S. Application Data

(62) Division of application No. 09/624,026, filed on Jul. 24, 2000, now Pat. No. 6,329,234.

(51) Int. Cl.$^7$ ............................................... H01L 29/43
(52) U.S. Cl. ..................... 257/531; 257/532; 257/751; 257/760; 257/762; 257/773
(58) Field of Search ................................ 257/531, 532, 257/751, 762, 773, 760

(56) References Cited

U.S. PATENT DOCUMENTS

| | | | |
|---|---|---|---|
| 5,194,932 A | 3/1993 | Kurisu | 257/773 |
| 5,208,726 A | 5/1993 | Apel | 257/532 |
| 5,293,510 A | 3/1994 | Takenaka | 257/295 |
| 5,406,447 A | 4/1995 | Miyazaki | 301/313 |
| 5,675,184 A | 10/1997 | Matsubayashi et al. | 257/728 |
| 5,879,985 A | 3/1999 | Gambino et al. | 438/253 |
| 6,140,693 A * | 10/2000 | Weng et al. | 257/532 |
| 6,166,423 A * | 12/2000 | Gambino et al. | 257/532 |
| 6,259,128 B1 * | 7/2001 | Adler et al. | 257/301 |
| 6,326,673 B1 * | 12/2001 | Liou | 257/531 |
| 6,346,454 B1 * | 2/2002 | Sung et al. | 438/396 |
| 6,426,249 B1 * | 7/2002 | Geffken et al. | 438/239 |

* cited by examiner

Primary Examiner—Olik Chaudhuri
Assistant Examiner—Stephen W. Smoot
(74) Attorney, Agent, or Firm—George O. Saile; Stephen B. Ackerman

(57) ABSTRACT

In many mixed-signal or radio frequency Rf applications, inductors and capacitors are needed at the same time. For a high performance inductor devices, a thick metal layer is needed to increase performance, usually requiring an extra masking process. The present invention describes both a structure and method of fabricating both copper metal-insulator-metal (MIM) capacitors and thick metal inductors, simultaneously, with only one mask, for high frequency mixed-signal or Rf, CMOS applications, in a damascene and dual damascene trench/via process. High performance device structures formed by this invention include: parallel plate capacitor bottom metal (CBM) electrodes and capacitor top metal (CTM) electrodes, metal-insulator-metal (MIM) capacitors, thick inductor metal wiring, interconnects and contact vias.

13 Claims, 5 Drawing Sheets

DUAL DAMASCENE INTERCONNECT STRUCTURES THAT INCLUDE RADIO FREQUENCY CAPACITORS AND INDUCTORS

CROSS-REFERENCE TO RELATED APPLICATION

This application is a division of and claims the priority benefit of "Copper MIM Structure and Process for Mixed-Signal and Rf Capacitors and Inductors," application Ser. No. 09/624,026 field Jul. 24, 2000 and now U.S. Pat. No. 6,329,234.

BACKGROUND OF THE INVENTION.

(1) Field of the Invention

The present invention describes both a structure and method of fabricating copper metal-insulator-metal (MIM) capacitors and thick metal inductors simultaneously, with only one addition mask, for high frequency mixed-signal or Rf, CMOS applications, in a dual damascene trench and via process.

(2) Description of the Relate Art

As a background to the current invention, in many mixed signal or high frequency Rf applications both high performance, high speed capacitors and inductors are required. Low series resistance, low loss, high Q and low (RC) time constants are required in these high frequency applications for high performance. In addition, it is important to fabricate device structures by processes compatible with CMOS processing with AlCu alloys to pure copper in dual damascene structures.

A metal-insulator-metal (MIM) capacitor is used commonly in high performance applications in CMOS technology. Typically, the capacitor has a sandwich structure and can be described as a parallel plate capacitor. The capacitor top metal (CTM) is separated from the capacitor bottom metal (CBM) by a thin insulating layer. Both two parallel plates are conventionally made from Al or AlCu alloys. These metals are patterned and etched needing several photolithography photo masking steps. The thin insulating dielectric layer is usually made from silicon oxide or silicon nitride deposited by chemical vapor deposition (CVD).

The damascene processing is a "standard" method for fabricating planar copper interconnects. Damascene wiring interconnects (and/or studs) are formed by depositing a dielectric layer on a planar surface, patterning it using photolithography and oxide reactive ion etch (RIE), then filling the recesses with conductive metal. The excess metal is removed by chemical mechanical polishing (CMP), while the troughs or channels remain filled with metal. For example, damascene wiring lines can be used to form bit lines in DRAM devices, with processing similar to the formation of W studs in the logic and DRAM devices. In both examples, sputtered Ti/TiN liners, underlying diffusion barriers, have been coated with chemical vapor deposited (CVD) W metal, then polished back to oxide.

In the dual-damascene process, a monolithic stud/wire structure is formed from the repeated patterning of a single thick oxide film followed by metal filling and CMP. First, a relatively thick oxide layer is deposited on a planar surface. The oxide thickness is slightly larger than the desired final thickness of the stud and wire, since a small amount of oxide is removed during CMP. Stud recesses are formed in the oxide using photolithography and RIE that either partially etches through the oxide or traverses the oxide and stops on the underlying metal to be contacted. The wire recesses can then be formed using a separate photolithography step and a timed oxide etching step. If the former stud RIE option is used, the wire etching completes the drilling of the stud holes.

Next, the stud/wire metallization is deposited, then planarized using CMP. The resulting interconnects are produced with fewer process steps than with conventional processing and with the dual damascene process, two layer of metal are formed as one, i.e., wiring line and contact stud vias, avoiding an interface between the layers.

Another metal deposition, besides sputtering techniques, has been adapted as a standard for copper metallization. This technique is electrochemical deposition (ECb) of copper. The electrochemical copper deposition (ECD) still needs, e.g., sputtering techniques, physical vapor deposition (PVD), to deposit thin underlying diffusion barrier film (Ta,TaN) and a conductive "seed" layer of copper.

Related patents and relevant literature now follow as Prior Art, summarized below.

U.S. Pat. No. 5,879,985 entitled "Crown Capacitor Using a Tapered Etch of a Damascene Lower Electrode" granted Mar. 9. 1999 to Gambino et al. shows a capacitor using a damascene process for the lower electrode. Upper capacitor structure has a "crown" type structure.

U.S. Pat. No. 5,406,447 entitled "Capacitor Used in an Integrated Circuit and Comprising Opposing Electrodes Having Barrier Metal Films in Contact with a Dielectric Film" granted Apr. 11, 1995 to Miyazaki teaches a process for a planar metal-insulator-metal (MIM) capacitor. Barrier metal films are composed of platinum,. palladium, tantalum, or titanium nitride. The capacitor dielectric material is either tantalum oxide or a perovskite oxide, such As strontium titanate or a composite of lead zirconate and lead titanate, which are ferroelectric type materials.

U.S. Pat. No. 5,208,726 entitled "Metal-Insulator-Metal (MIM) Capacitor-Around-Via Structure for a Monolithic Microwave Integrated Circuit (MMIC) and Method of Manufacturing Same" granted May 4, 1993 to Apel teaches a MIM capacitor structure and method for monolithic microwave IC applications. A low inductance connection is provided between a front side MIM capacitor and a backside ground plane.

U.S. Pat. No. 5,194,932 entitled "Semiconductor Integrated Circuit Device" granted Mar. 16, 1993 to Kurisu teaches a metal-insulator-metal (MIM) capacitor method. The ground pattern, the insulating inter layer, and the power source pattern come together to form a MIM type capacitor.

U.S. Pat. No. 5,293,510 entitled "Semiconductor Device with Ferroelectric and Method of Manufacturing the Same" granted Mar. 8, 1994 to Takenaka discloses a ferroelectric capacitor process.

U.S. Pat. No. 5,675,184 entitled "Integrated Circuit Device" granted Oct. 7, 1997 to Matsubayashi et al. teaches a metal-insulator-metal (MIM) capacitor process in an Rf application. Thermoplastic material and magnetic substance layers are described.

SUMMARY OF THE INVENTION

The present invention describes a structure and method of fabricating copper metal-insulator-metal (MIM) capacitors and thick metal inductors simultaneously, using only one photolithography mask, for high frequency, mixed-signal or Rf, CMOS applications, in a dual damascene trench and via process.

The structure and process embodiments of this invention start with the first process step, the forming by damascene and chemical mechanical polishing (CMP) the first level inlaid metal structures. The process sequence is as follows: an insulating layer is deposited. This first insulating layer, e.g., silicon oxide, is patterned and reactive ion etched (RIE) upon a semiconductor substrate. The next processing step in building of the damascene structure, is the deposition by sputtering (PVD, physical vapor deposition) and patterning of a thin metal barrier layer (trench liner), e.g. Ta,TaN, and a thin copper seed layer. Copper metal is deposited upon the seed layer in the openings in insulator by electrochemical copper deposition (ECD). The excess copper metal is polished off and planarized with surface by chemical mechanical polishing (CMP) forming the first level metal for the capacitor bottom metal (CBM) layer.

Continuing with the summation of the structure and process embodiments of this invention, is the second step in this CMOS process, the deposition of a copper metal protecting "buffer layer". This layer is needed to prevent, copper corrosion with silicon oxide layers. It is deposited over the first level inlaid metal structures and first insulator layer. This buffer layer is, e.g., silicon nitride. The third process step is the blanket deposition of an intermetal dielectric (IMD) layer upon the buffer layer. This intermetal dielectric (IMD) is, e.g., silicon oxide, silicon nitride, or FSG fluoro-silicate glass, or PSG phosphosilicate glass. The fourth step is to form a photoresist masking layer by a lithography process, defining simultaneously both the metal-insulator-metal (MIM) capacitor and inductor area, over the first level of metal. Photoresist is coated and patterned upon the intermetal dielectric (IMD) layer. A reactive ion etch (RIE) is performed to etch the intermetal dielectric layer (IMD) layer, forming openings and stopping on the buffer layer. The fifth step is removal of the photoresist material and the metal protecting buffer layer in the exposed opening areas. The sixth and seventh steps are the deposition of both a insulating protecting buffer layer, i.e., silicon nitride, and an insulating layer, i.e., silicon oxide.

Another embodiment of this invention is that the insulating protecting buffer layer (described above) and the insulator layer (described above) can be combined into just one silicon nitride layer, as an alternate process step. This consolidates the processing.

Continuing with the summation of the structure and process embodiments of this invention is the eighth step, the deposition of a conducting metal buffer layer, i.e., tantalum nitride. The ninth step is the formation of a "standard" dual damascene structure with contact via and interconnect trench. In addition, the metal-insulator-metal (MIM) capacitor and inductor structures are nearly completed in the following processes. The via and trench structures are produced by photoresist patterning and reactive ion etching (RIE) processes primarily in the layer of intermetal dielectric (IMD). Also etched in this part of a standard dual damascene process are the conducting metal buffer layer, insulator layer, insulating protecting buffer layer and the copper metal protecting "buffer layer".

A key process step and yet another embodiment of this invention is that the metal-insulator-metal capacitor (MIM) and inductor areas are protected during the aforementioned standard dual damascene process. The patterning photoresist is stripped exposing all open areas: trench/via area and MIM/Inductor area. Next, all the open areas in the intermetal (IMD) consisting of MIM/Inductor area, via and trench (for interconnect line) structures are filled with a conductive metal protect buffer layer, tantalum nitride.

Another key embodiment of this invention is the tenth process in this CMOS compatible process. This processing step is the processing needed to form simultaneously: both the standard dual damascene copper metals structures with contact vias, interconnect trenches and metal-insulator-metal (MIM) capacitors and, at the same time, inductors structures. The open areas in the intermetal dielectric (IMD) consists of: MIM/Inductor areas, vias and trenches (interconnect lines) structures. These open areas are filled with a conductive copper metal on top of the conductive metal protect buffer layer.

Continuing with the summation of the structure and process embodiments of this invention is the eleventh process step. This processing step is the forming simultaneously of standard dual damascene copper metals structures with contact via, interconnect trench and, at the same time, both the metal-insulator-metal (MIM) capacitor and inductor structures by damascene and chemical mechanical polishing (CMP) back the excess metal to form inlaid copper metal structures. The excess copper metal and excess conductive metal protect buffer layer are polished off and planarized with surface by chemical mechanical polishing (CMP) forming inlaid copper which remains in the open regions. An embodiment of this invention, which is both a process and structure variation, is to chem-mech polish back: both the excess copper (described above) and the excess metal protect buffer layer (described above), polishing through the excess insulator layer and stopping on the insulating protect buffer layer.

In yet another embodiment of the present invention is another process variation or process option or the eleventh step, which is to chem-mech polish back: both the excess copper and excess metal protect buffer layer, polishing through both the excess insulator layer and the excess insulating protect buffer layer, and finally stopping on the intermetal dielectric (IMD) layer. The end result is the formation, by damascene and chemical mechanical polishing (CMP), of inlaid copper metal structures (with slightly more copper metal removal than described in the previous process step): interconnect/trench, contact/via and MIM/inductor.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include.

DESCRIPTION OF THE PREFERRED EMBODIMENT

Figure 1:
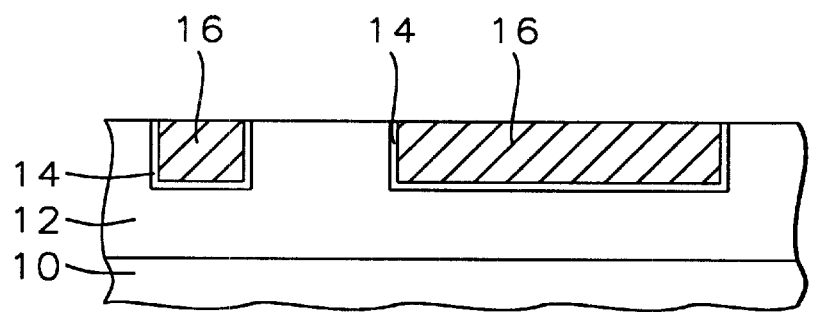
FIG. 1, which in cross-sectional representation, is sketched the first step in this CMOS process; the forming by damascene and CMP the first level inlaid metal structures.

The present invention teaches a new and improved structure and method of fabricating copper metal-insulator-metal (MIM) capacitors and thick metal inductors, simultaneously, with only one mask, for high frequency, mixed-signal or Rf, CMOS applications, in a dual damascene trench and via process.

When AC circuit modeling of thin film metal-insulator-metal capacitors, several factors are important for high performance, high frequency if applications and modeling gives insight into desired structure, process and material properties. Firstly, these thin film capacitors can be modeled as parallel plate capacitors. Several factors become important at high frequencies: C, capacitance versus f, frequency response, ESR, equivalent series resistance at a fixed frequency, EPR, equivalent parallel resistance at a fixed frequency, and tan delta or loss factor, D. Good electrical properties for metal-insulator-metal (MIM) thin film capacitors are: the C vs f almost flat from 10 KHz to 1 GHz, and D vs f with low D values. The key term for high frequency applications is the values of the ESR, which should be low resistance tin Ohms). An increase in the loss factor D with frequenty indicates a series resistance loss problem; conversely, a decrease in D with increasing frequency indicates a parallel resistance loss problem. A combination of the mechanisms can also occur yielding $D_{max}$ and $D_{min}$ values vs f. As mentioned above, these modeling values are important in high performance device applications and can give insight into the material and structure of the MIM capacitors. For example, in using a silicon crystal as an electrode, the resistance of the silicon is important in yielding a high ESR term. The series resistance terms were found to be much higher for silicon electrodes than for metallic electrodes, due to the higher resistance of the semiconductor.

Furthermore, important to this invention, low resistance metal lines for high frequency inductor devices are also important for high performance. Thick metal lines for inductor devices improve the high frequency performance and these thick metal lines are necessary in these high frequency, mixed-signal or Rf, CMOS applications, usually requiring a special, separate and extra photo masking step.

For modeling the MIM capacitor, for high frequency applications, the capacitor components can be represented by an R-C equivalent circuit. Some of the key terms are: $R_c$, contact (ohmic) resistance, $R_p$, resistance which characterizes leakage through dielectric, and $R_s$, internal series resistance of the dielectric. Best high frequency properties are for an "ideal" MIM capacitor are achieved by the following: $R_p$, equivalent parallel resistance (which characterizes leakage through dielectric) approaches infinity, while both the $R_c$, contact (ohmic) resistance, and the $R_s$, internal series resistance of the dielectric both approach zero. The high frequency, high performance inductor, capacitor and resistor device properties can be characterized, tested, measured and modeled by an LCR bridge instrument or network analyzer.

The metal-insulator-capacitor (MIM) in the present invention is formed with copper electrodes and the insulator is silicon oxide, deposited by chemical vapor deposition (CVD) with a dielectric constant of about 3.9 in a thickness range from about 100 to 600 Angstroms.

Referring to FIG. 1 illustrated in cross-sectional drawing, is sketched the start of the structure and process embodiments of this invention. The general process of the prevent invention is described in the following. The first step (for reference STEP ONE) in this CMOS process is the forming by damascene and chemical mechanical polishing (CMP) the first level inlaid metal structures 16. The process sequence is as follows: an insulating layer 12 is deposited. This first insulating layer 12 or layer of dielectric, e.g., silicon oxide, is patterned and reactive ion etched (RIE) upon a semiconductor substrate 10. The next processing step in building of the damascene structure, is the deposition by sputtering (PVD, physical vapor deposition) and patterning of a thin metal barrier layer 14 or barrier material (trench liner), e.g. Ta, TaN, and a thin copper seed layer (too thin to sketch in Figs.), for subsequent electrochemical copper deposition (ECD) of copper. The barrier layer is in a thickness range from about 100 to 4,000 Angstroms. The seed layer is in a thickness range from about 4,000 to 40,000 Angstroms. Copper metal, in a thicknesses range from about 10,000 to 10,000 Angstroms, is deposited upon the need layer in the openings in insulator 12 by electrochemical copper deposition (ECD). The excess copper metal is polished off and planarized with surface chemical mechanical polishing (CMP) forming the first level conductor wiring 16 (copper metal remaining inlaid in the open regions) for the capacitor bottom metal (CEM) 16 layer, which is in thickness range from approximately 5,000to 12,000 Angstroms.

Figure 2:
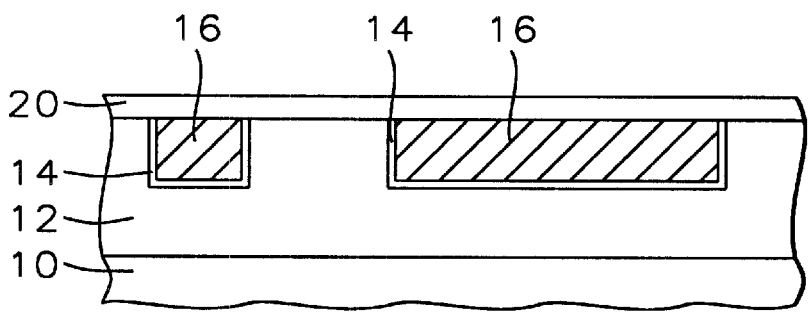
FIG. 2, which illustrated in cross-sectional drawing, is sketched the second step in this CMOS process, the deposition of a copper metal protecting "buffer layer".

Referring to FIG. 2 illustrated in cross-sectional drawing, is sketched a continuation of the structure and process embodiments of this invention. The second step (for reference STEP TWO) in this CMOS process is the deposition of a copper metal protect "buffer layer" 20, needed to prevent copper corrosion with silicon oxide layers, over the first level inlaid metal structures 16 and first insulator layer 12. This buffer layer 20 is, e.g., silicon nitride, thickness range from approximately 200 to 1,200 Angstroms.

Figure 3:
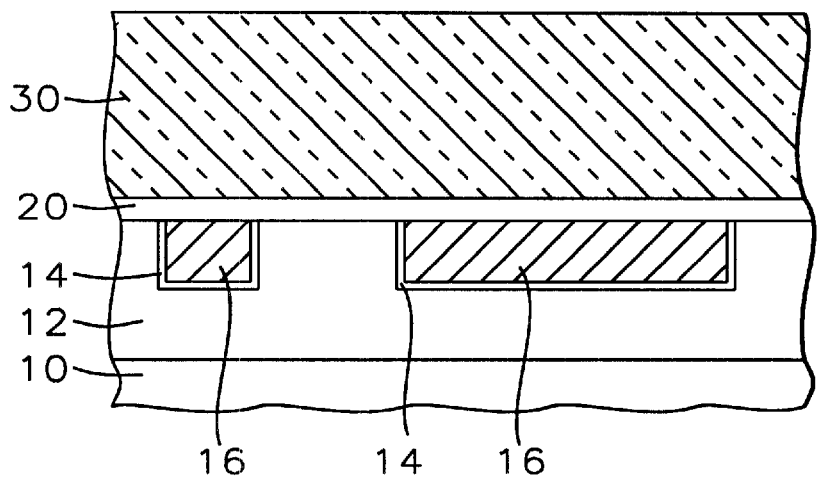
FIG. 3, which illustrated in cross-sectional drawing, is the third step in this CMOS process, the blanket deposition of an intermetal dielectric (IMD) layer.

Referring to FIG. 3 illustrated in cross-sectional drawing, is sketched a continuation of the stricture and process embodiments of this invention. The third step (for reference STEP THREE) in this CMOS process is the blanket deposition of an intermetal dielectric (IMD) layer 30 upon the buffer layer 20. This intermetal dielectric (IMD) is, e.g., silicon oxide, silicon nitride deposited by chemical vapor deposition (CVD), or FSG fluoro-silicate glass, or PSG phosphosilicate glass.

Figure 4:
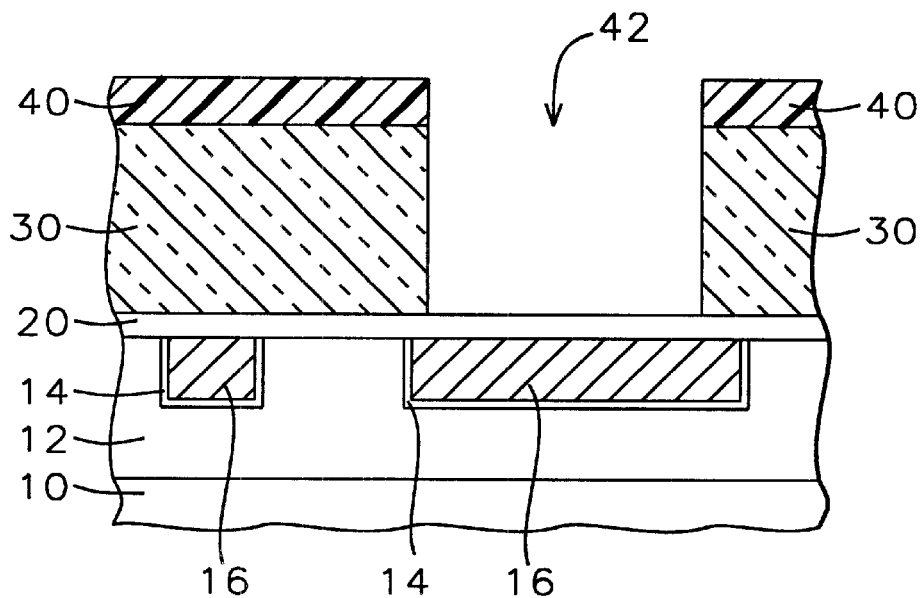
FIG. 4, which illustrated in cross-sectional drawing, is the fourth step in this CMOS process, the forming by a photo-lithography process simultaneously both the metal-insulator-metal (MIM) capacitor and inductor area, over the first level of metal.

Referring to FIG. 4 illustrated in cross-sectional drawing, is sketched a continuation of the structure and process embodiments of this invention. The fourth step (for reference STEP FOUR) in this CMOS process is to form a photoresist masking layer by a lithography process, defining simultaneously both the metal-insulator-metal (MIM) capacitor and inductor area 42, over select portions of the first level of metal 16. Photoresist 40 is coated and patterned upon the intermetal dielectric (IMD) layer 30. A reactive ion etch (RIE) is performed to etch the intermetal dielectric layer (IMD) layer 30, forming opening 42, termed MIM/Inductor damascene openings, and stopping on the buffer layer 20. Again, this etched intermetal dielectric (IMD)) is, e.g., silicon oxide, silicon nitride, or FSG fluoro-silicate glass, or PSG phosphosilicate glass.

Figure 5:
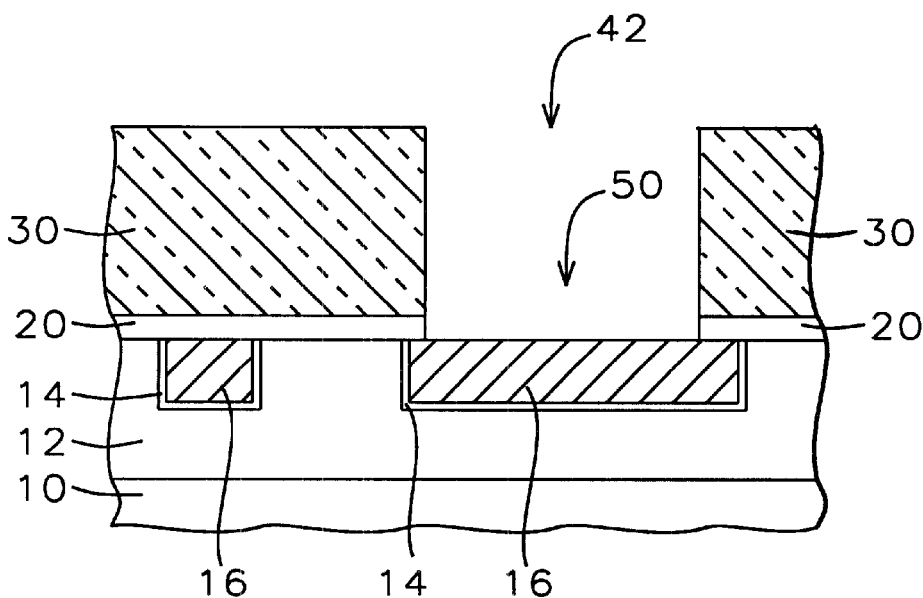
FIG. 5, which illustrated in cross-sectional drawing, shows the fifth step in this CMOS process, the removal of the photoresist material and the metal protecting buffer layer, that is exposed in the opening.

Referring to FIG. 5 illustrated in cross-sectional drawing, is sketched a continuation of the structure and process embodiments of this invention. The fifth step (for reference STEP FIVE) in this CMOS process is removal of the photoresist material 40 (in FIG. 4) and the metal protecting buffer layer 20 in the exposed opening 50.

Figure 6:
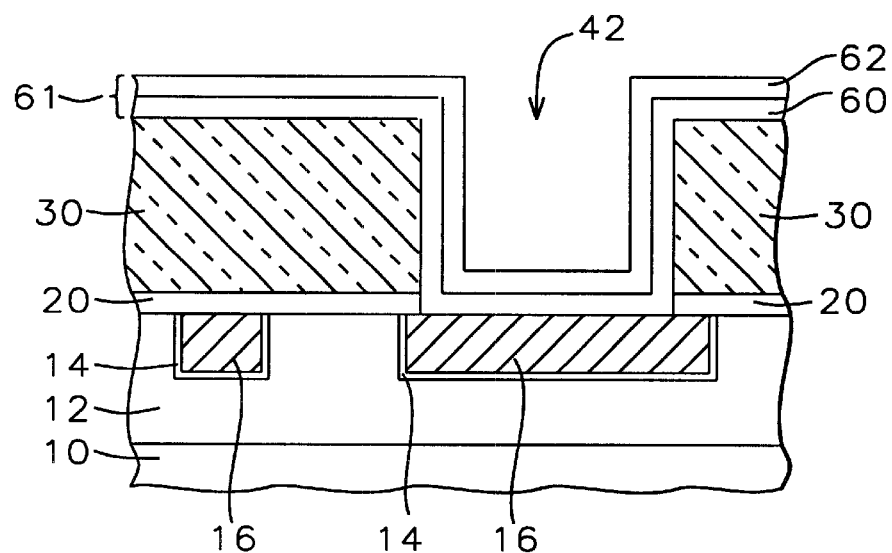
FIG. 6, which in cross-sectional representation, illustrates the sixth and seventh steps in this CMOS process, the deposition of both a insulating protecting bender layer and an insulating layer.

Referring to FIG. 6 illustrated in cross-sectional drawing, is sketched a continuation of the structure and process embodiments of this invention. The sixth and seventh steps (for reference STEP SIX and STEP SEVEN) in this CMOS process are the deposition of both an insulating protect buffer layer 60, i.e., silicon nitride, and an MIM insulating layer 62, i.e., silicon oxide. Another embodiment is that the insulating protecting buffer layer 60 and the insulator layer 62 can be combined into just one silicon nitride layer 61, as an alternate process step.

The metal-insulator-capacitor (MIM) in the present invention is formed with copper electrodes and the MIM insulating layer can be, as described above in FIG. 6, silicon oxide (62), deposited by chemical vapor deposition (CVD) with a dielectric constant of about 3.9, in a thickness range from about 100 to 600 Angstroms.

Figure 7:
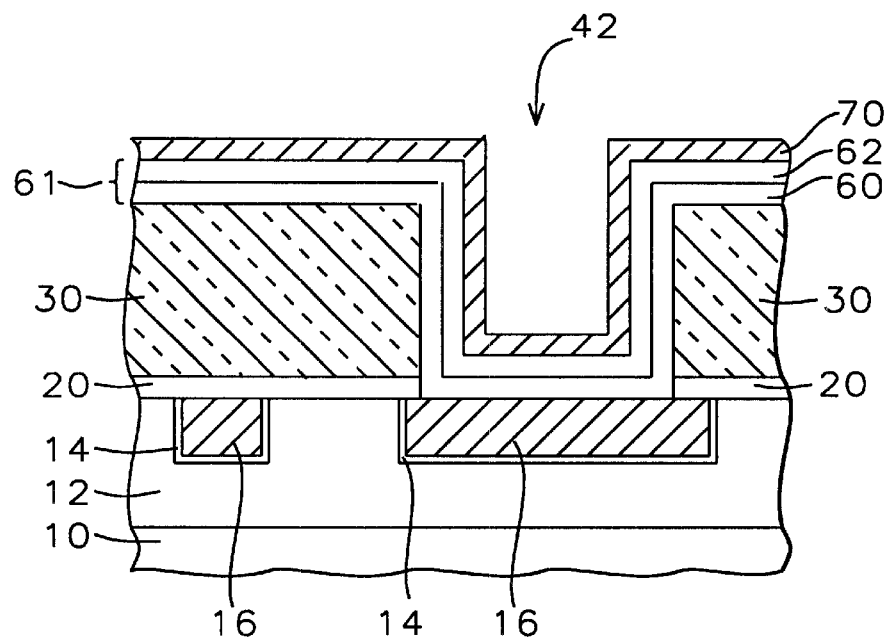
FIG. 7, which in cross-sectional representation, illustrates the eighth step in this CMOS process, the deposition of a conducting metal buffer.

Referring to FIG. 7 illustrated in cross-sectional drawing, is sketched a continuation of the structure and process embodiments of this invention. The eighth step (for reference STEP EIGHT) in this CMOS process is the deposition of a conducting metal buffer layer 70, i.e., tantalum nitride.

Figure 8:
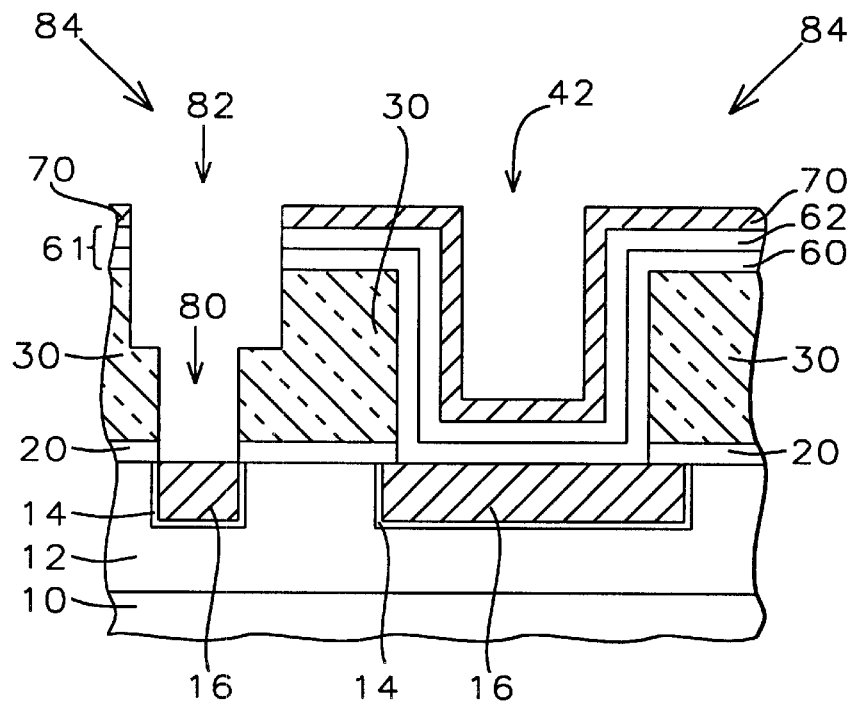
FIG. 8, which in cross-sectional representation, illustrates the ninth step in this CMOS process, the formation of a "standard" dual damascene structure with contact via and interconnect trench.

Referring to FIG. 8 illustrated in cross-sectional drawing, is sketched a continuation of the structure and process embodiments of this invention. The ninth steep (for reference STEP NINE) in this CMOS process is the formation of a "standard" dual damascene structure with contact via and interconnect trench. In addition, the metal-insulator-metal (MIM) capacitor and inductor structures are nearly completed in the following processes. Referring to FIG. 8, the via 80 and trench 82 structures are produced by photoresist patterning and reactive ion etching (RIE) processes primarily in the layer of intermetal dielectric 30 (IMD). Also etched in this part of a standard dual damascene process a e the conducting metal buffer layer 70, insulator layer 62, insulating protecting buffer layer 60 and the copper metal protecting "buffer layer" 20. One key process step and another embodiment of this invention is that the metal-insulator-metal capacitor (MIM) and inductor areas 42 are protected during the above standard dual damascene process. The patterning photoresist is stripped exposing all open areas: trench/via area and MIM/Inductor area. Next, all the open areas in the intermetal dielectric (IMD) consisting of MIM/Inductor area 42, via 80 and trench 82 (interconnect line) structures are filled with a conductive metal protect buffer layer 84, tantalum nitride (too thin to be shown in Figs).

Figure 9:
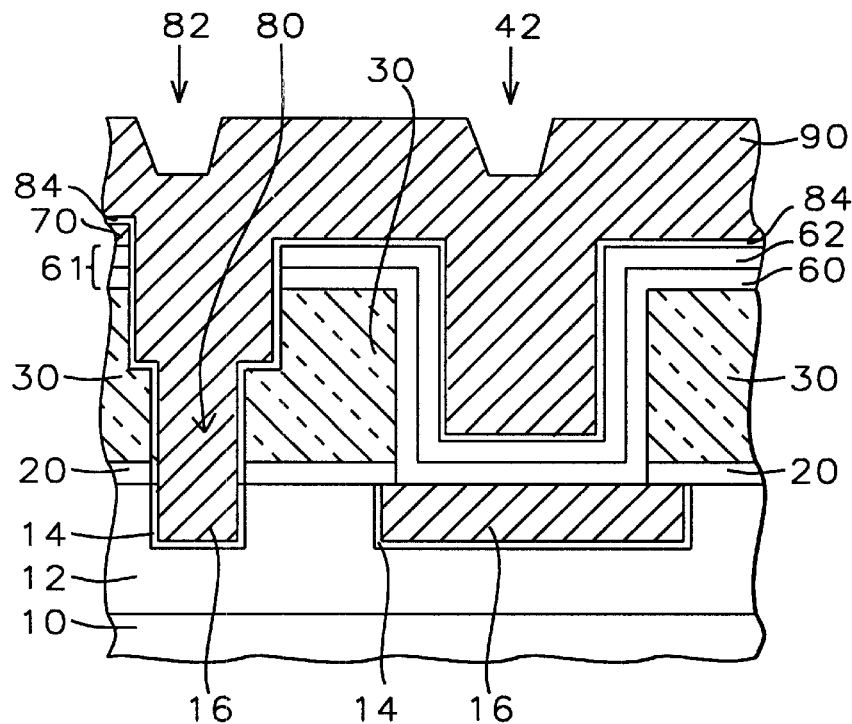
FIG. 9, which in cross-sectional representation, illustrates the tenth step in this CMOS process, the processing used to form simultaneously: both standard dual damascene copper metals structures and metal-insulator-metal (MIM) capacitor and inductor structures.

Referring to FIG. 9 illustrated in cross-sectional drawing, is sketched a continuation of the structure and process embodiments of this invention. The tenth step (for reference STEP TEN) in this CMOS process is the processing step needed to form simultaneously: both standard dual damascene copper metals structures with contact aria, interconnect trench and, at the same time, the metal-insulator-metal (MIM) capacitor and inductor structures. Referring to FIG. 9, the open areas in the intermetal dielectric (IMD) consisting of MIM/Inductor area 42, via 80 and trench 82 (interconnect line) structures are filled with thick conductive copper metal 90 on top of the conductive metal protect buffer layer 84 (too thin to be shown in Figs). The thick copper is useful for the inductor device (not shown in FIG. 9). The thick copper is deposited by electrochemical deposition (ECD), an a thickness range from approximately 5,000 to 21,000 Angstroms.

Figure 10:
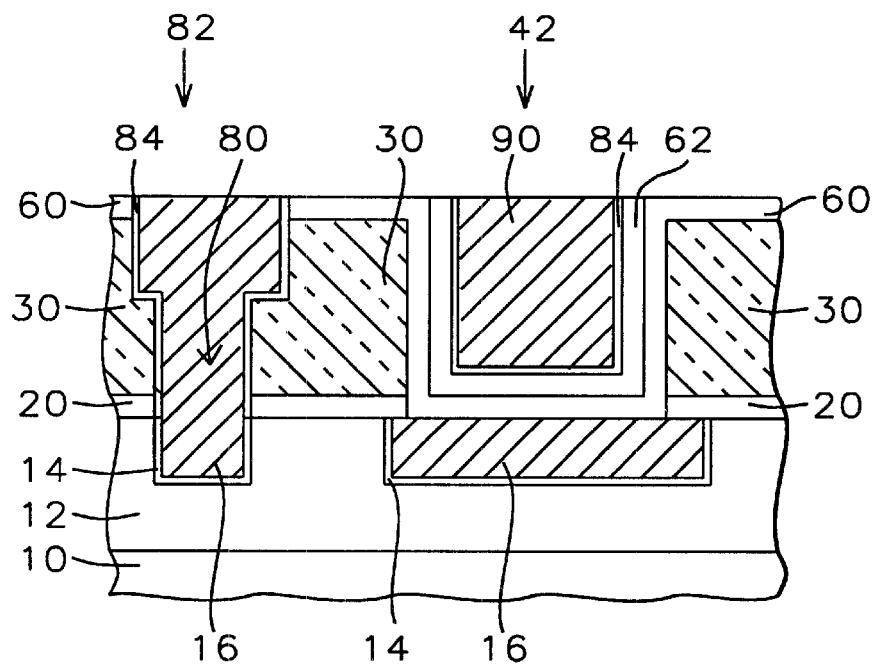
FIG. 10, which in cross-sectional representation, illustrates the eleventh step in this CMOS process, the step to form simultaneously standard dual damascene copper metals structures with contact via, interconnect trench and both the metal-insulator-metal (MIM) capacitor and inductor structures.

Referring to FIG. 10 illustrated in cross-sectional drawing, is sketched a continuation of the structure and process embodiments of this invention. The eleventh step (for reference STEP ELEVEN) in this CMOS process is the step to form simultaneously standard dual damascene copper metals structures with contact via 80, interconnect trench 82 and, at the same time, both the metal-insulator-metal (MIM) capacitor and inductor structures 42. Referring to FIG. 10, in this CMOS process step is the forming by damascene and chemical mechanical polishing (CMP) of the inland copper metal structures: interconnect/trench 82, contact/via 80 and MIM/inductor 42. The excess copper metal and excess conductive metal protect buffer layer 84 are polished off and planarized with surface by chemical mechanical polishing (CMP) forming inlaid copper which remains in the open regions. One embodiment and a process and structure variation is to chem-mech polish back the excess copper and excess metal protect buffer layer, polishing through the excess insulator layer 62 and stopping on the insulating protect buffer layer 60, as shown in FIG. 10.

A brief summary of the metal thickness layers and capacitor dielectric follows. The capacitor cop metal (CTM) metal final thickness is from approximately 6,000 to 18,000 Angstroms. The interconnect line metal, final thickness is from approximately 2,000 to 15,000 Angstroms. The interconnect/via metal final thickness and final inductor metal line thickness are both from approximately 6,000 to 18,000 Angstroms. The capacitor bottom metal (CBM) layers is in thickness range from approximately 5,000 to 12,000 Angstroms. The metal-insulator-capacitor (MIM) insulator is silicon oxide, deposited by chemical vapor deposition (CVD) with a dielectric constant of about 3.9 in a thickness range from about 100 to 600 Angstroms.

Figure 11:
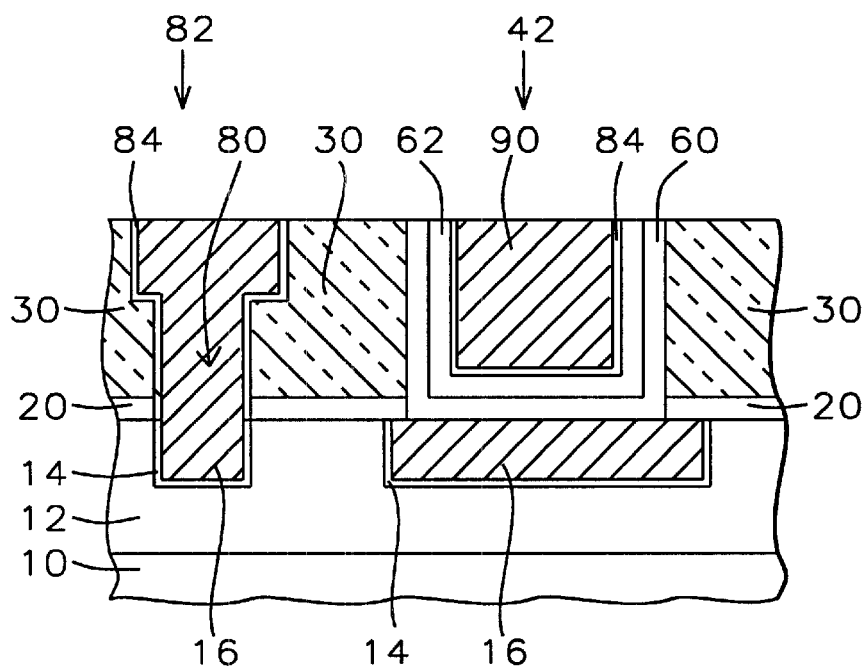
FIGS. 11, which in cross-sectional representation, illustrates a process option of the eleventh step in this CMOS process, a process variation, which is a process option. The chem-mech polish back of excess copper and metal protect buffer layer is extended through the excess insulator layer, excess insulating protect buffer layer, and stops on the intermetal dielectric (IMD) layer.

Referring to FIG. 11, illustrated in cross-sectional drawing, is yet another embodiment of the present invention. This is a process option or process variation of the eleventh step in this CMOS process. This process and structure variation is to chem-mech polish back the excess copper and excess metal protect buffer layer, polishing through the excess insulator layer 62 and excess insulating protect buffer layer 60, stopping on the intermetal dielectric (IMD) layer 30. The end result, refer to FIG. 11, is the formation by damascene and chemical mechanical polishing (CMP) the inlaid copper metal structures (with slightly more copper metal removed than in FIG. 10): interconnect/trench 82, contact/via 80 and MIM/inductor 42.

While the invention has been particularly shown and described with reference to the preferred embodiments thereof, it will be understood by those skilled in the art that various changes in form and details may be made without departing from the spirit and scope of the invention.

What is claimed is:

1. A parallel plate capacitor and thick metal inductor structure comprising:
   (a) a semiconductor substrate or IC module, having a layer of dielectric;
   (b) an underlying metal diffusion barrier layer and overlying a first level conductor wiring metal formed in said dielectric layer;
   (c) a metal protect buffer layer formed over said first level conductor wiring layer;
   (d) an intermetal dielectric (IMD) layer formed over said metal protect buffer layer;
   (e) a plurality of metal-insulator-metal MIM/Inductor damascene area openings selectively formed in beth said intermetal dielectric (IMD) layer and in said metal protect buffer layer;
   (f) a passivating insulating protect buffer layer formed over said intermetal dielectric and over exposed first level conductor wiring;
   (g) an MIM insulating layer formed over said insulating protect buffer layer;
   (h) a conductive metal protect buffer layer formed over said MIM insulating layer;
   (i) dual damascene via/trench openings selectively formed in said intermetal dielectric (IMD) layer;
   (j) conducting inlaid thick metal for high performance formed in all openings to form dual damascene trench interconnects, contact vias, and metal-insulator-metal (MIM) capacitor top metal (CTM) electrodes/inductor thick metal line structures.

2. The parallel plate capacitor and thick metal inductor structure of claim 1, wherein high performance metal-insulator-metal (MIM) capacitor inductor devices are formed simultaneously and with dual damascene trench interconnects and contact vias.

3. The parallel plate capacitor and thick metal inductor structure of claim 1, wherein high performance metal-insulator-metal (MIM) capacitor and inductor devices are formed simultaneously for mixed signal and high frequency Rf CMOS circuits, logic and memory device and circuit applications.

4. The parallel plate capacitor and thick metal inductor structure of claim 1, wherein said substraate is semiconductor single crystal silicon or an IC module.

5. The parallel plate capacitor and thick metal inductor structure of claim 1, wherein said via/trench openings contain a barrier selected from the group consisting of Ta, TaN and Ta/TaN in a thickness range from about 100 to 4,000 Angstroms.

6. The parallel plate capacitor and thick metal inductor structure of claim 1, wherein said conductor or conducting material consists of the following:
   parallel plate capacitor bottom metal (CBM) electrodes and capacitor top metal (CTM) electrodes, Inductor metal wiring, interconnects and contact vias, selected from the group consisting of Cu, AlCu alloys, AlCuSi alloys, and W.

7. The parallel plate capacitor and thick metal inductor structure of claim 1, wherein said conducting inlaid thick metal comprises a copper seed layer liner, for parallel plate capacitor bottom metal (CBM) electrodes and capacitor top metal (CTM) electrodes, Inductor metal wiring, interconnects and contact vias, seed type materials comprised of thin Cu, thickness from 4,000 to 4,000 Angstroms.

8. The parallel plate capacitor and thick metal inductor structure of claim 1, wherein said damascene inlaid conducting material layers forming conducting interconnect lines and contact vias for parallel plate capacitor bottom metal (CBM) electrodes and capacitor top metal (CTM) electrodes, Inductor metal wiring, interconnects and contact vias, comprises copper, upon a copper seed layer, Cu thickness from 1,000 to 10,000 Angstroms.

9. The parallel plate capacitor and thick metal inductor structure of claim 1, wherein said dielectric layer, intermetal dielectric layer (IMD), and MIM insulating layer are composed of silicon dioxide or silicon oxide, and/or silicon nitride.

10. The parallel plate capacitor and thick metal inductor structure of claim 1, wherein said insulating protect buffer layer is silicon nitride.

11. The parallel plate capacitor and thick metal inductor structure of claim 1, wherein said insulating protect buffer layer can be combined with said MIM insulating layer to form just one layer and the material used is silicon nitride.

12. The parallel plate capacitor and thick metal inductor structure of claim 1, wherein said contact via and/or trench interconnect is formed simultaneously for the parallel plate capacitor metal-insulator-metal MIM/Inductor area structure, to combine inductor and lower metal layer structures, capacitor bottom metal (CBM) and capacitor top metal (CTM) with thick metal inductor lines.

13. The parallel plate capacitor and thick metal inductor structure of claim 1, wherein said conducting metal interconnects, contact vias and metal-insulator-metal (MIM)/Inductors structures can form multilevel structures by repeating the formation of the said structures described herein, by repeating steps (c) through (j).

* * * * *